United States Patent [19]

DeLuca

[11] 4,155,475

[45] May 22, 1979

[54] BONDING OF SAPPHIRE TO SAPPHIRE BY EUTECTIC MIXTURE OF ALUMINUM OXIDE AND ZIRCONIUM OXIDE

[75] Inventor: John J. DeLuca, Silver Spring, Md.

[73] Assignee: The United States of America as represented by the Administrator of the National Aeronautics and Space Administration, Washington, D.C.

[21] Appl. No.: 645,502

[22] Filed: Dec. 30, 1975

Related U.S. Application Data

[60] Continuation of Ser. No. 506,803, Sep. 17, 1974, abandoned, which is a division of Ser. No. 322,997, Jan. 12, 1973, Pat. No. 3,859,714.

[51] Int. Cl.² ............................................. H01K 1/36
[52] U.S. Cl. ........................................ 220/2.2; 65/43; 156/89
[58] Field of Search ...................... 220/2.2; 65/43, 36; 29/472.7; 156/89; 161/182

[56] References Cited

U.S. PATENT DOCUMENTS

| | | | |
|---|---|---|---|
| 2,533,512 | 12/1950 | Samuel | 220/2.2 |
| 3,267,204 | 8/1966 | Peters | 65/43 |
| 3,459,569 | 8/1969 | Ellis | 65/43 |
| 3,474,277 | 10/1969 | Zollweg | 220/2.2 |
| 3,508,938 | 4/1970 | Jones | 156/89 |

*Primary Examiner*—Lenard A. Footland
*Attorney, Agent, or Firm*—Robert F. Kempf; Ronald F. Sandler; John R. Manning

[57] ABSTRACT

Bonding of an element comprising sapphire, ruby or blue sapphire to another element of such material with a eutectic mixture of aluminum oxide and zirconium oxide. The bonding mixture may be applied in the form of a distilled water slurry or by electron beam vapor deposition. In one embodiment the eutectic is formed in situ by applying a layer of zirconium oxide and then heating the assembly to a temperature above the eutectic temperature and below the melting point of the material from which the elements are formed. The formation of a sapphire rubidium maser cell utilizing eutectic bonding is shown.

5 Claims, 3 Drawing Figures

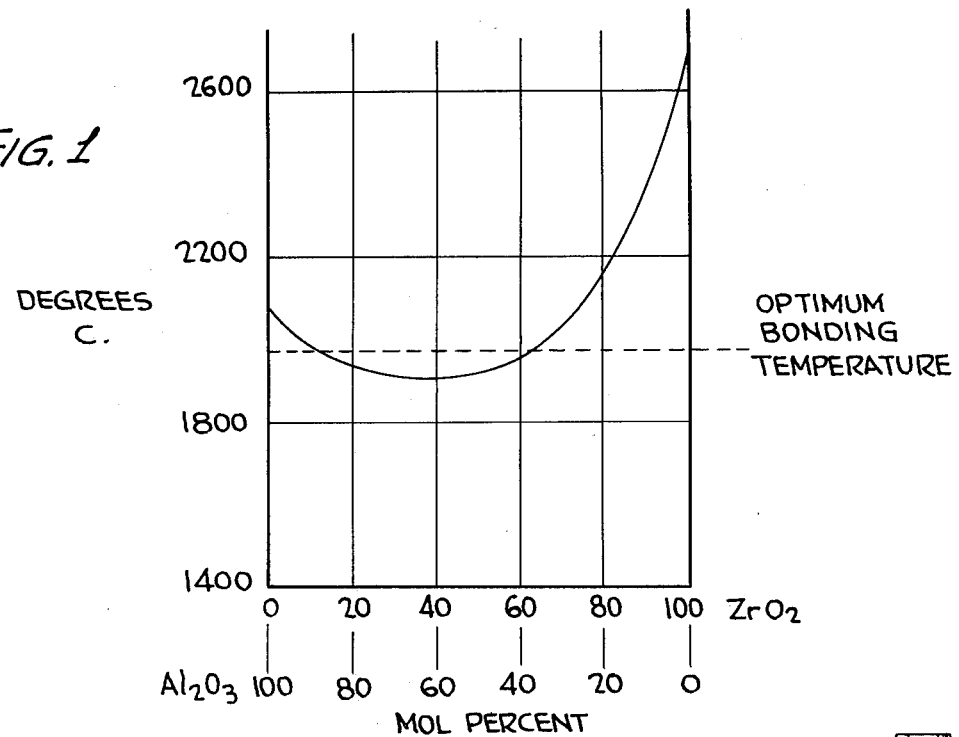
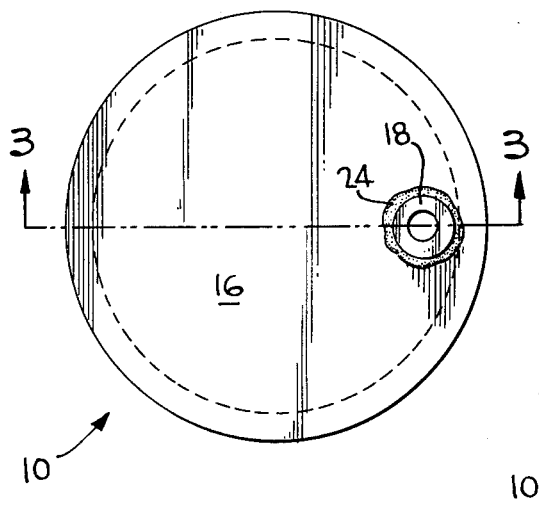
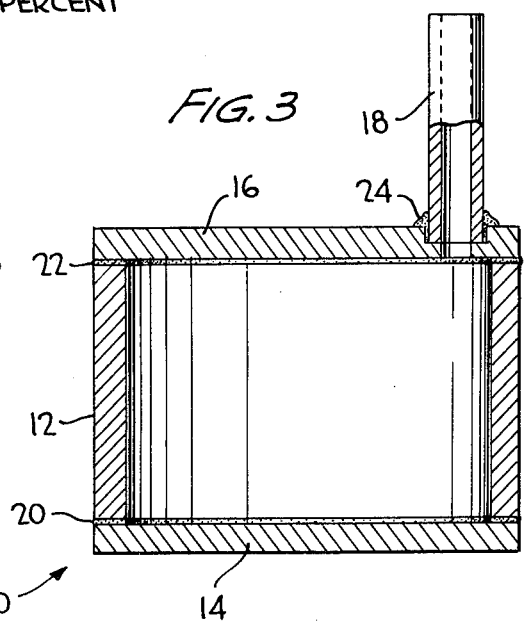

BONDING OF SAPPHIRE TO SAPPHIRE BY EUTECTIC MIXTURE OF ALUMINUM OXIDE AND ZIRCONIUM OXIDE

ORIGIN OF THE INVENTION

The invention described herein was made by an employee of the United States Government and may be manufactured and used by and for the Government for governmental purposes without the payment of any royalties thereon or therefor.

This is a continuation, of application Ser. No. 506,803, now abandoned, filed Sept. 17, 1974, which is a divisional application of application Ser. No. 322,997, filed Jan. 12, 1973, now U.S. Pat. No. 3,859,714.

BACKGROUND OF THE INVENTION

This invention relates the bonding of an element comprising sapphire, ruby or blue sapphire to another element of such material and relates particularly to the use of a eutectic mixture of aluminum oxide and zirconium oxide to bond such elements to each other. Specifically, the instant inventive concepts relate to the formation of an article such as a sapphire rubidium maser cell with a eutectic bonding agent, although similar concepts can be used for the formation of various articles from such materials such as thermionic convertors, vacuum tubes, high temperature sapphire lamp bulbs and the like.

Particular problems exist in bonding of sapphire to sapphire to form a closed cell that can be outgassed at a high temperature, evacuated and filled with rubidium vapor as in the formation of a sapphire rubidium maser cell. The cell must be vacuum tight after sealing and non-reactive to the rubidium vapor. Sapphire has such a narrow temperature range between solid and liquid, only 1° C., that it is impractical to bond sapphire to sapphire directly.

Most bonding heretofore has been done at low temperature with cementitious materials or at elevated temperatures with the use of metalizers and brazing techniques or by the use of graded glass sealing techniques. Most metals and glass outgas at high temperatures in a vacuum or otherwise react with the rubidium vapor thereby contaminating the cell.

SUMMARY OF THE INVENTION

The instant invention relates to an improved method of bonding sapphire ($Al_2O_3$), ruby ($Al_2O_3+Cr$) or blue sapphire ($Al_2O_3+Fe'T_1O_2$) wherein the bonding is accomplished at high temperatures, and unlike sintering, is formed by a eutectic mixture that becomes fluid at the bonding temperature and wets the surfaces to be bonded. Thus, the basic object of the instant invention is the provision of a bonding technique for sapphire, ruby or blue sapphire elements which results in a mechanically strong bond between the elements that is vacuum tight and highly resistant to chemical attack.

More specifically, it is an important object of this invention to provide for the production of a sapphire rubidium maser cell wherein the bond between the sapphire elements is such that the cell can be outgassed at a higher temperature prior to filling than any other known sealing technique. Moreover, according to the instant inventive concepts, the resultant bond is specifically highly resistant to attack by alkali vapors such as rubidium and cesium.

In accordance with this invention, a eutectic mixture of aluminum oxide and zirconium oxide is formed at an interface between surfaces of the elements to be bonded, this mixture, while molten, spreading over the interface and wetting the surfaces to be bonded thereby resulting in a vacuum tight and mechanically strong bond which will withstand temperature cycling at high level.

According to a preferred feature of the invention, the bond is composed mostly of $Al_2O_3$ so as to have the closest thermal expansion match to the sapphire from which the elements being bonded are formed.

Various techniques may be utilized to provide the eutectic mixture. For example, the eutectic can be formed in situ by depositing a layer of zirconium oxide on the surfaces to be bonded and, after assembly, heating the article to a temperature above the eutectic temperature and below the melting of sapphire whereby the eutectic will be formed between the zirconium oxide and the aluminum oxide of the sapphire at the interface. Alternatively, a homogeneous mixture of aluminum oxide and zirconium oxide powders in a distilled water slurry can be painted onto the surfaces to be bonded resulting in the eutectic mixture when the temperature has been raised to the proper level. The zirconium oxide or a mixture of aluminum oxide and zirconium oxide can also be applied to the surfaces by electron beam vapor deposition and, it is within the concepts of this invention to first form zirconium aluminate from a mixture of aluminum oxide and zirconium oxide, and then to grind this material into a powder which is utilized for the formation of the eutectic bonding agent.

BRIEF DESCRIPTION OF THE DRAWING

The invention itself will be better understood and additional features and advantages thereof will become apparent to those skilled in the art from the following detailed description of preferred embodiments, such description making reference to the accompanying drawing wherein:

FIG. 1 is a liquidus curve of aluminum oxide and zirconium oxide;

FIG. 2 is a plan view of a sapphire rubidium maser cell formed utilizing the instant inventive concepts; and FIG. 3 is a transverse cross-section or view thereof taken substantially along the lines 3—3 of FIG. 2.

Like reference numerals refer to like parts throughout the several views of the drawing.

DETAILED DESCRIPTION OF THE PREFERRED EMBODIMENTS

Referring now to the drawing, and more particularly to FIG. 1, a liquidus curve for aluminum oxide and zirconium oxide is shown. At any temperature above the liquidus line, a mixture of the two ingredients will form a eutectic. Since the melting point of sapphire is 2050° C. it is only necessary to operate within a temperature range above the liquidus curve and below the melting point.

In FIGS. 2 and 3 a sapphire rubidium maser cell is designated generally by the reference numeral 10 and will be seen to comprise a cylindrical body element 12, a lower end plate 14, an upper end plate 16 and an evacuation tube 18. The lower and upper end plates 14, 16 are bonded to the body element 12 by the eutectic mixture as shown at 20, 22, respectively, and the evacuation tube 18 is bonded to the upper plate 16 by the eutectic mixture as shown at 24. The thickness of the eutectic bonding layer is exaggerated in the drawing for illustrative clarity since the smallest quantity of eutectic mixture should be utilized consistent with providing an adequate bond. Generally, a layer on the order of about 0.005 inches is adequate, depending on the closeness of the fit of the parts.

As indicated previously, it is desirable to select a proportion between the materials that has the lowest melting point on the liquidus curve and also the highest percentage of aluminum oxide so that the bond is composed primarily of aluminum oxide and, therefore, has the closest thermal expansion match to the sapphire. Thus, a preferred mixture comprises 75 mol percent aluminum oxide with 25 mol percent zirconium oxide, although it will be seen from FIG. 1 that the eutectic mixture can comprise from about 85 to about 35 mol percent aluminum oxide with from about 15 to about 65 mol percent zirconium oxide. The bonding temperature, depending upon the particular mixture of ingredients being utilized can vary from the liquidus point up to the melting point of the material of the elements being bonded, a preferred temperature range being between 1900® and 2000° C., with approximately 1975° C. being optimum.

In order to insure homogeneity in the eutectic, it is desirable to use powders of relatively fine particle size, 300 mesh or finer being generally acceptable, although the optimum material has a particle size of about 325 mesh.

According to one embodiment of the instant inventive concept, a mixture of aluminum oxide and zirconium oxide powders may be formed into a slurry with distilled water painted onto the surface to be bonded, and, after assembly, allowed to dry for approximately two hours. The assembly is then placed in a high temperature furnace and fired in air, inert gas or vacuum, raising the temperature from ambient at a temperature above the liquidus or eutectic temperature and below the melting point of the material from which the elements being bonded are formed over a period of approximately two hours. The eutectic temperature is maintained for approximately ½ hour and then the assembly is cooled to ambient over a period of about four hours. Of course, the times given are merely illustrative and not critical to the instant inventive concepts. After cooling, the bonding assembly will withstand temperature cycling up to 1800° C.

It is preferable to have the bonding surfaces ground to fit, the orientation of the crystalline axis of the individual parts being matched when assembled so as to reduce stresses.

It is also helpful to apply a small holding force on the assembly and to pull a vacuum in the furnace chamber while the bonds are molten so as to exclude entrapped air in the bond.

An alternate method of applying the bonding mixture is by electron beam vapor deposition of either the powder mixture or solid crystals of the same composition as the powder mixture. This method has the advantage of avoiding the necessity for drying of the assembled parts and there is less air entrapment in the bond.

While the use of a mixture of aluminum oxide and zirconium oxide insures the desired proportion of these ingredients in the eutectic mixture, it is possible to form the eutectic in situ by depositing a layer of zirconium oxide onto the surfaces to be bonded by an electron beam vacuum deposition, assembling the elements, heating the same in a furance and otherwise processing the assembly as indicated previously, thereby resulting in the formation of the eutectic mixture in situ from the zirconium oxide and the aluminum oxide of the elements themselves at the interface.

Although reference has been made in the detailed description primarily to sapphire, it is to be understood that similar techniques are applicable to ruby and blue sapphire.

Following the techniques of the instant inventive concepts a vacuum tight, mechanically strong bond is formed which is highly resistant to chemical attack, and specifically to attack by alkali vapors such as rubidium and cesium. A sapphire rubidium maser cell formed according to these techniques can be outgassed at a high temperature, evacuated and filled with rubidium vapor according to known techniques without deleteriously affecting the bond between the elements, resulting in a vacuum tight seal which is non-reactive to the rubidium vapor. Thus, it will be seen that the objectives set forth at the outset of the specification are successfully achieved by the use of the instant inventive concepts.

I claim:

1. An article comprising a plurality of elements formed of a material selected from the group consisting of sapphire, ruby and blue sapphire bonded to one another at their interfaces by a eutectic mixture of aluminum oxide and zirconium oxide.

2. An article according to claim 1 wherein said eutectic mixture comprises from about 85 to about 35 mol percent aluminum oxide with from about 15 to about 65 mol percent zirconium oxide.

3. An article according to claim 1 wherein said elements form a cell.

4. An article according to claim 1 wherein said elements form a vacuum cell.

5. An article according to claim 1 wherein said elements form a maser cell.

* * * * *